United States Patent
Ong et al.

(10) Patent No.: US 8,164,182 B2
(45) Date of Patent: Apr. 24, 2012

(54) HYPER THERMALLY ENHANCED SEMICONDUCTOR PACKAGE SYSTEM COMPRISING HEAT SLUGS ON OPPOSITE SURFACES OF A SEMICONDUCTOR CHIP

(75) Inventors: You Yang Ong, Kuantan (MY); Zurina binti Zukiffly, Penang (MY); Saat Shukri bin Embong, Selangor (MY)

(73) Assignee: Stats Chippac Ltd., Singapore (SG)

( * ) Notice: Subject to any disclaimer, the term of this patent is extended or adjusted under 35 U.S.C. 154(b) by 14 days.

(21) Appl. No.: 11/164,209

(22) Filed: Nov. 14, 2005

(65) Prior Publication Data

US 2006/0131735 A1 Jun. 22, 2006

Related U.S. Application Data

(60) Provisional application No. 60/628,198, filed on Nov. 15, 2004.

(51) Int. Cl.
 *H01L 23/34* (2006.01)
(52) U.S. Cl. ........ 257/707; 257/675; 257/719; 257/778; 257/E23.101
(58) Field of Classification Search .................. 257/720, 257/722, 675, 706, 707, 778
See application file for complete search history.

(56) References Cited

U.S. PATENT DOCUMENTS

| | | | | |
|---|---|---|---|---|
| 5,293,301 A | * | 3/1994 | Tanaka et al. ................ | 361/707 |
| 5,311,402 A | * | 5/1994 | Kobayashi et al. ........... | 361/760 |
| 5,448,106 A | * | 9/1995 | Fujitsu .......................... | 257/668 |
| 5,767,572 A | * | 6/1998 | Fujitsu .......................... | 257/668 |
| 5,834,839 A | | 11/1998 | Mertol ........................... | 257/704 |
| 5,872,395 A | | 2/1999 | Fujimoto ....................... | 257/675 |
| 5,977,626 A | | 11/1999 | Wang et al. ................... | 257/707 |
| 5,991,156 A | * | 11/1999 | Bond et al. .................... | 361/707 |
| 6,130,477 A | * | 10/2000 | Chen et al. .................... | 257/712 |
| 6,184,580 B1 | * | 2/2001 | Lin ................................ | 257/712 |
| 6,201,301 B1 | | 3/2001 | Hoang ........................... | 257/712 |
| 6,323,065 B1 | | 11/2001 | Karnezos ...................... | 438/122 |
| 6,507,102 B2 | | 1/2003 | Juskey et al. ................. | 257/706 |
| 6,566,166 B2 | | 5/2003 | Chien ........................... | 438/108 |
| 6,573,595 B1 | | 6/2003 | Chen et al. .................... | 257/698 |
| 6,580,611 B1 | * | 6/2003 | Vandentop et al. ........... | 361/704 |
| 6,586,829 B1 | | 7/2003 | Yaniv et al. ................... | 257/693 |
| 6,596,565 B1 | | 7/2003 | Hembree ...................... | 438/122 |
| 6,599,779 B2 | | 7/2003 | Shim et al. .................... | 438/122 |
| 6,602,737 B2 | | 8/2003 | Wu ................................ | 438/122 |
| 6,617,684 B2 | | 9/2003 | Akram et al. ................. | 257/712 |
| 6,781,242 B1 | | 8/2004 | Fan et al. ...................... | 257/777 |
| 6,853,069 B2 | | 2/2005 | Akram et al. ................. | 257/706 |
| 6,882,041 B1 | | 4/2005 | Cheah et al. .................. | 257/704 |
| 2001/0048158 A1 | * | 12/2001 | Lin ................................ | 257/737 |
| 2004/0238944 A1 | * | 12/2004 | Bish et al. ..................... | 257/706 |

\* cited by examiner

*Primary Examiner* — Wael Fahmy
*Assistant Examiner* — Abul Kalam
(74) *Attorney, Agent, or Firm* — Ishimaru & Associates LLP; Mikio Ishimaru; Stanley Chang

(57) ABSTRACT

A semiconductor package system is provided including mounting a semiconductor chip to a substrate having a substrate opening. A first heat slug is attached to a first surface of the semiconductor chip at least partially encapsulating the semiconductor chip. A second heat slug is attached to the second surface of the semiconductor chip through the substrate opening.

10 Claims, 4 Drawing Sheets

HYPER THERMALLY ENHANCED SEMICONDUCTOR PACKAGE SYSTEM COMPRISING HEAT SLUGS ON OPPOSITE SURFACES OF A SEMICONDUCTOR CHIP

CROSS-REFERENCE TO RELATED APPLICATION(S)

This application claims the benefit of U.S. Provisional Patent Application Ser. No. 60/628,198, filed Nov. 15, 2004, and the subject matter thereof is hereby incorporated herein by reference thereto.

TECHNICAL FIELD

The present invention relates generally to semiconductor package systems, and more particularly to thermally enhanced semiconductor package systems.

BACKGROUND ART

The increasing density of electrical connections in semiconductor devices has pushed conventional packages to their design limit. Heat generated by the semiconductor devices needs to be dissipated immediately to prevent them from overheating. As the semiconductor devices become denser, the generated heat also increases correspondingly. More and more packages are now designed with heat sinks or heat slugs to enhance the ability to dissipate heat.

With smaller package footprint, ball grid array (BGA) packages have been introduced and developed several years ago. BGA includes a family of package 'styles', differentiated primarily by construction materials and techniques, such as plastic (PBGA) or ceramic (CBGA). Other BGA packages include tape automated bonding ball grid array (TAB-BGA) and cavity down (CD-BGA) type of construction.

Higher device working frequency (3.3 MHz and above) with increased clock speed rates have required the creation of other versions of BGA: enhanced BGA (EBGA), thermally enhanced BGA (TEBGA I & II), heat spreader BGA (HS-BGA), and micro super BGA (mBGA or m Super-BGA). However, all BGA packages, regardless of package style, utilize solder attachments (balls) located directly underneath the package body. Thus, during reflow, a significant portion of the heat energy required to melt these connections must be conducted through the package body itself. Consequently, the materials and their relative locations within the package can influence the thermal profile of the package.

A BGA package typically includes a substrate, such as printed circuit board, made from reinforced polymer laminate material, i.e. bismaleimide triazine (BT) or a polyimide resin with series of metal traces on the top side. The metal traces are connected by vias to the bottom side of the substrate, and redistributed in an array grid around the periphery of the substrate. The semiconductor chip, having a plurality of bond pads, is mounted to the substrate using soft solder or epoxy. The bond pads are wires bonded to connect the chip to the package substrate or are bonded using solder bump for flip-chips. The whole package is then encapsulated with a molding compound above the top portion of the package substrate. Lastly, the solder balls are attached and reflowed to enhance electrical conductivity.

However, a need still remains for a low-cost effective design with enhanced heat dissipation capability. In view of cost considerations and the increasingly limited space, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system comprising mounting a semiconductor chip to a substrate having a substrate opening. A first heat slug is attached to a first surface of the semiconductor chip at least partially encapsulating the semiconductor chip. A second heat slug is attached to the second surface of the semiconductor chip through the substrate opening.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The term "horizontal" as used herein is defined as a plane parallel to the conventional plane or surface of the top heat slug, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
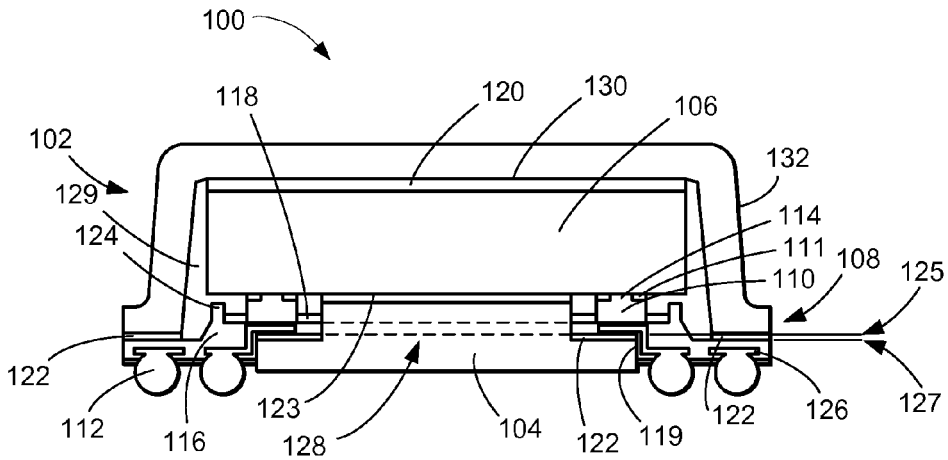
FIG. 1 is a schematic diagram of a cross-sectional view of a hyper thermally enhanced ball grid array package in accordance with a first embodiment of the present invention.

Referring now to FIG. 1, therein is shown a schematic diagram of a cross-sectional view of a hyper thermally enhanced ball grid array (HTEBGA) package 100 in accordance with a first embodiment of the present invention. The HTEBGA package 100 is a chip scale package (CSP) having ball grid array (BGA) input/outputs.

To increase the heat dissipation capability of the HTEBGA package 100, a top heat slug 102 and a bottom heat slug 104 encapsulate and protect a semiconductor chip 106 mounted inside the HTEBGA package 100. The semiconductor chip 106 is shown as a flip-chip but is merely an example of what can be packaged since the semiconductor chip 106 would be understood by those having ordinary skill in the art from the present disclosure to be multiple chips or even other packages. In one example, the semiconductor chip 106 can be as large as ⅘ of the total package case outline with a thickness ranging from 6 to 25 mils.

The top heat slug 102 and the bottom heat slug 104 act as thermal dissipation paths for heat to be dissipated. Both the top heat slug 102 and the bottom heat slug 104 are preferably metallic and can be made from materials such as pure copper, copper alloys, or silicate and vanadium doped copper compounds. The silicate doping is used to reduce thermal mismatch between the metallic heat slugs and the semiconductor chip 106. The vanadium doping provides stress relief between the copper and the silicate.

The structure of the top heat slug 102 is made concave with a horizontal top 1 30 and sidewalls 132 formed downward about 7° to 10° from the vertical. The sidewalls 132 flare at the bottom into a flange or a cap flash 108. The cap flash 108 serves as reinforcement for package sealing as well as minimizing compression stress from thermal mismatches of the semiconductor chip 106 and the top heat slug 102. For chip size packages, the cap flash 108 would be typically 2-3 mm in horizontal width.

Arranged in line or in staggered dual rows around the top of the semiconductor chip 106 are bond pads 111, generally made of Al—Si—Cu. Stud bumps 114, generally of copper, are bonded to the bond pads 111. The stud bumps 114 assist in halting the formation of inter-metallic growth due to Kirkendall voids in solder joints caused by thermal mismatch and temperature cycling.

The semiconductor chip 106 is flipped-over for chip-attach using flip-chip bonding to a substrate 116.

The substrate 116 is a multi-layer substrate having a substrate opening 128 and a recessed cavity 119. The substrate opening 128 and the recessed cavity 119 reduce the total package weight and enhance substrate structural flexibility. The substrate is generally a reinforced polymer laminate material, such as organic bismaleimide triazine (BT), or a polymide resin, containing through vias for connecting top and bottom conductive traces.

Solder pillars/ball bumps 110 are formed connected to the top traces and in a solder mask 118, which is pre-plated on non-contact areas of the substrate 116. The substrate 116 also includes vertical build-up wings 124. The vertical build-up wings 124 are designed to control the solder mask structure and solder joint sustainability during chip mount reflow as well as to enhance internal package structural robustness during the second re-flow after ball mounting.

The stud bumps 114 are mounted on the solder pillars/ball bumps 110 and then heat reflow forms interconnections of the semiconductor chip 106 to the substrate 116. The substrate 116 includes the vertical build-up wings 124 circumscribed by vertical planes of a perimeter of, and spaced apart from, the semiconductor chip 106. During reflow, the solder pillars/ball bumps 110 self-realign to the exact location of the bond pads 111 and the solder mask 118 strengthens the solder pillars/ball bumps 110 after heat reflow.

Once the semiconductor chip 106 is mounted, an adhesive 120 including a non-brittle interconnect material, such as soft solder paste or epoxy, is applied to the formerly bottom surface of the semiconductor chip 106 which is facing upward after chip-attach. The adhesive 120 can be conductive to enhance heat conduction between the semiconductor chip 106 and the top heat slug 102. The cap flash 108 of the top heat slug 102 is coated with a non-conductive adhesive (NCA) 122 or a non-conductive elastomer (NCE) to enhance sealing.

Then, the top heat slug 102 is placed, using a pattern recognition system, above the substrate 116 to be attached thereto by the NCA 122. The cap flash 108 of the top heat slug 102 serves as a platform for sealing against the substrate 116. Heat from about 175° C. and 180° C. is applied in-line during the sealing process to cure the adhesive 120. The semiconductor chip 106 may be hermetically sealed to the substrate 116 using a vacuum applied through the substrate opening 128.

A further sealant or heat conductive epoxy 129 can be injected through the substrate opening 128 to also help provide a hermetic seal around the semiconductor chip 106.

The substrate opening 128 is then used to enable the bottom heat slug 104 to penetrate through the substrate 116 and directly make contact with the semiconductor chip 106 for enhanced heat conduction. Because most of the active circuit layers are in the top of the semiconductor chip 106 adjacent the bond pads 111, there is a need to have a faster heat dissipation path on the top to channel out all heat generated to the package ambient. The bottom heat slug 104 performs this function by under hanging the substrate 116 in the recessed cavity 119 to provide additional heat convention surface area for the HTEBGA package 100. The bottom heat slug 104 is connected to the substrate 116 at a horizontal plane 125 of the substrate 116 at or above a horizontal plane 127 of the substrate 116, which connects to the ton heat slug 102.

The under hang feature includes: the thickness of the bottom heat slug 104 exceeding the thickness of the substrate 116, the bottom heat slug 104 protruding from the substrate 116 during flip-over and after mounting. The protrusion of the bottom heat slug 104 is, however, less than the standoff height required after solder balls attachment with a minimum clearance of 1.25 mm reserved. The bottom heat slug 104 is engaged with the substrate 116.

The size of the bottom heat slug 104 is almost equal to the size of the opening of the substrate opening 128 in the substrate 116. The bottom heat slug 104 is attached to the bottom surface of the semiconductor chip 106 by the conductive adhesive 123 and to the substrate 116 by the NCA 122. The bottom surface of the semiconductor chip 106 may include a phosphosilicate glass (PSG) or SiN polyimide capping layer 121 around the stud bumps 114. The bottom heat slug 104 passes through the substrate opening 128 of the substrate 116, using a package flip-over and drop-in method. Connection of the bottom heat slug 104 is achieved using a conductive adhesive 123.

Once connection of the bottom heat slug 104 is made, solder balls 112 are prepared at a blank substrate-mounting template having an exact imprint of the bottom surface of the substrate 116 including metal connector pads 126, which are connected to the bond pads 111 on the semiconductor chip 106. The enclosed package (with the top heat slug 102 and the bottom heat slug 104) is then picked up to be flip-over again, using a pattern recognition system to align the edges of the substrate 116 to the substrate-mounting template edge which contains the solder balls 112 in a pre-determined pattern. Mounting is achieved once the placement is done and subjected to package reflow. The embodiment of the present invention is ready for testing and branding.

Figure 2:
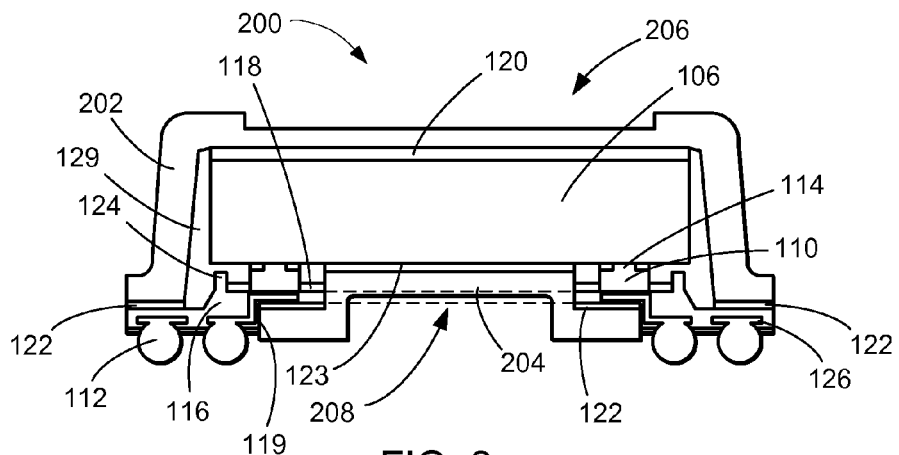
FIG. 2 is a schematic diagram of a cross-sectional view of a hyper thermally enhanced ball grid array package in accordance with a second embodiment of the present invention.

Referring now to FIG. 2, therein is shown a schematic diagram of a cross-sectional view of a hyper thermally enhanced ball grid array (HTEBGA) package 200 in accordance with a second embodiment of the present invention. A top heat slug 202 and a bottom heat slug 204 encapsulate and protect the semiconductor chip 106 mounted inside the HTEBGA package 200. The top heat slug 202 is above the substrate 116. The HTEBGA package 200 includes similar elements from the HTEBGA package 100 of FIG. 1.

The top heat slug 202 has a top recess 206 or a reduced top surface thickness, or thinner by ⅗ of the total heat slug thickness, in the form of round or rectangular indentation in the center of the top heat slug 202. The bottom heat slug 204 also has a bottom recess 208, or a reduced surface thickness in the form of a round or rectangular indentation in the center of the bottom heat slug 204. Such embodiment further enhances heat dissipation capability due to larger effective heat dissipation area as well as reducing vertical thermal mismatch loading.

Figure 3:
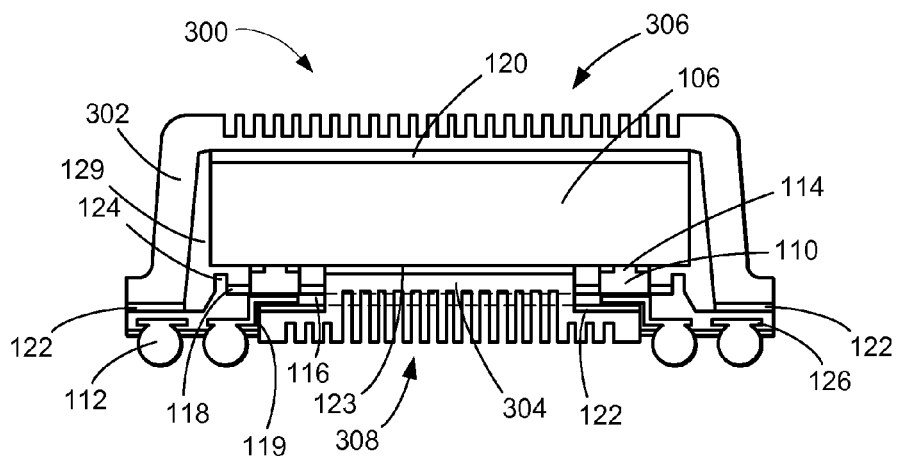
FIG. 3 is a schematic diagram of a cross-sectional view of a hyper thermally enhanced ball grid array package in accordance with a third embodiment of the present invention.

Referring now to FIG. 3, therein is shown a schematic diagram of a cross-sectional view of a hyper thermally enhanced ball grid array (HTEBGA) package 300 in accordance with a third embodiment of the present invention.

A top heat slug 302 and a bottom heat slug 304 encapsulate and protect the semiconductor chip 106 mounted inside the HTEBGA package 300. The top heat slug 302 is above the substrate 116. The HTEBGA package 300 includes similar elements from the HTEBGA package 100 of FIG. 1.

The top heat slug 302 and the bottom heat slug 304 include heat-spreader fins 306 and 308, respectively. The heat-spreader fins 306 and 308 are built-in vertically and appear from the respective top and bottom surfaces of the top heat slug 302 and the bottom heat slug 304 (after mounting) to the inner part of the top heat slug 302 and the bottom heat slug 304 with ⅗ depth of fin length. Such design further enlarges the total effective area for heat dissipation as well as promotes air circulation for faster cooling effect.

Figure 4:
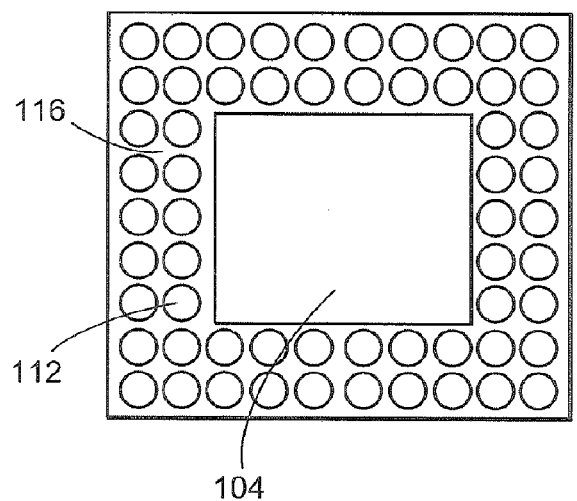
FIG. 4 is a schematic diagram of a bottom view of a hyper thermally enhanced ball grid array package in accordance with a first embodiment of the present invention.

Referring now to FIG. 4, therein is shown a schematic diagram of a bottom view of a hyper thermally enhanced ball grid array package in accordance with a first embodiment of the present invention corresponding to FIG. 1. The bottom heat slug 104 is located in the center the substrate 116. The solder balls 112 are shown around the bottom heat slug 104.

Figure 5:
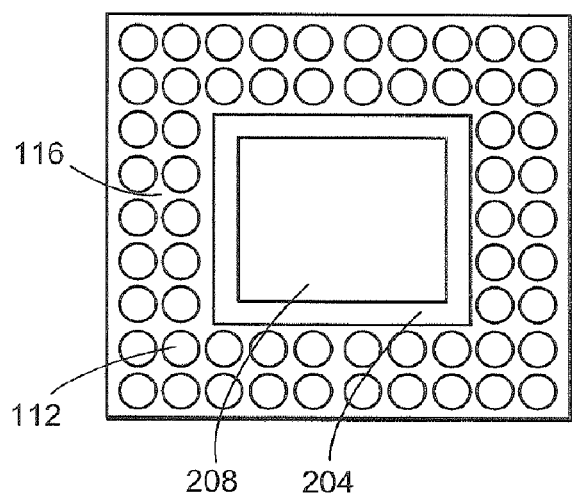
FIG. 5 is a schematic diagram of a bottom view of a hyper thermally enhanced ball grid array package in accordance with a second embodiment of the present invention.

Referring now to FIG. 5, therein is shown a schematic diagram of a bottom view of a hyper thermally enhanced ball grid array package in accordance with a second embodiment of the present invention. The bottom heat slug 204 is located in the center the substrate 116. The bottom heat slug 204 includes the bottom recess 208 in its the center. The solder balls 112 are shown around the bottom heat slug 104.

Figure 6:
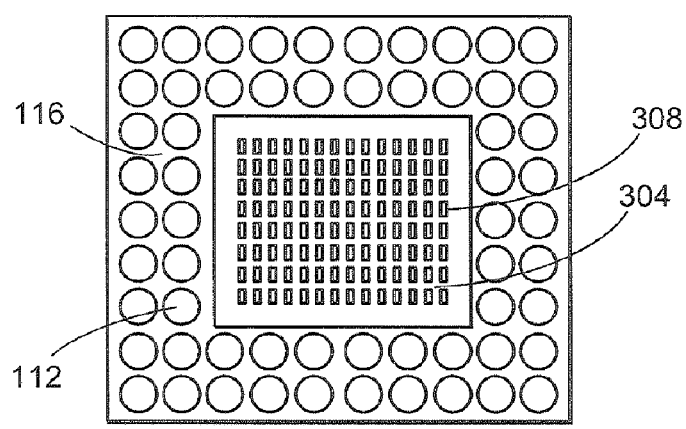
FIG. 6 is a schematic diagram of a bottom view of a hyper thermally enhanced ball grid array package in accordance with a third embodiment of the present invention.

Referring now to FIG. 6, therein is shown a schematic diagram of a bottom view of a hyper thermally enhanced ball grid array package in accordance with a third embodiment of the present invention. The bottom heat slug 304 is located in the center the substrate 116. The bottom heat slug 304 includes the heat-spreader fins 308. The solder balls 112 are shown around the bottom heat slug 104.

Figure 7:
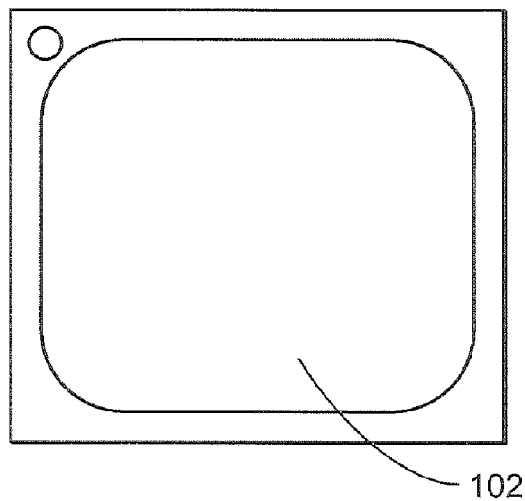
FIG. 7 is a schematic diagram of a top view of a hyper thermally enhanced ball grid array package in accordance with a first embodiment of the present invention.

Referring now to FIG. 7, therein is shown a schematic diagram of a top view of a hyper thermally enhanced ball grid array package in accordance with a first embodiment of the present invention.

Figure 8:
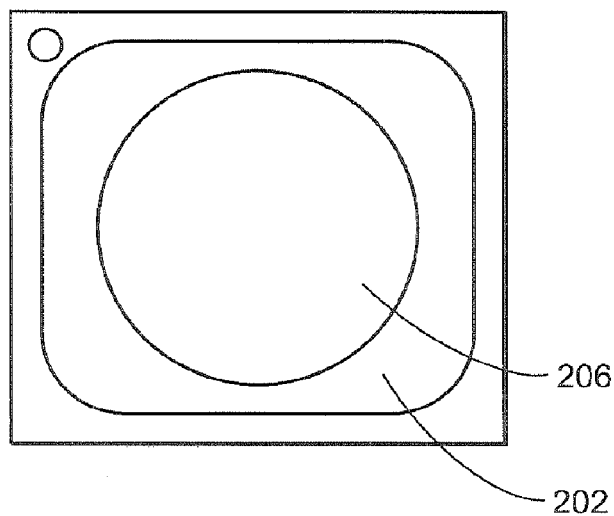
FIG. 8 is a schematic diagram of a top view of a hyper thermally enhanced ball grid array package in accordance with a second embodiment of the present invention.

Referring now to FIG. 8, therein is shown a schematic diagram of a top view of a hyper thermally enhanced ball grid array package in accordance with a second embodiment of the present invention. The top heat slug 202 includes the top recess 206 in its center.

Figure 9:
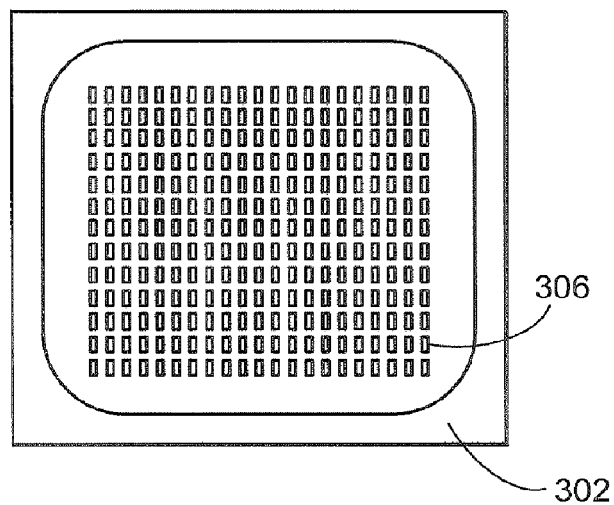
FIG. 9 is a schematic diagram of a top view of a hyper thermally enhanced ball grid array package in accordance with a third embodiment of the present invention.

Referring now to FIG. 9, therein is shown a schematic diagram of a top view of a hyper thermally enhanced ball grid array package in accordance with a third embodiment of the present invention. The top heat slug 302 includes the heat-spreader fins 306.

Figure 10:
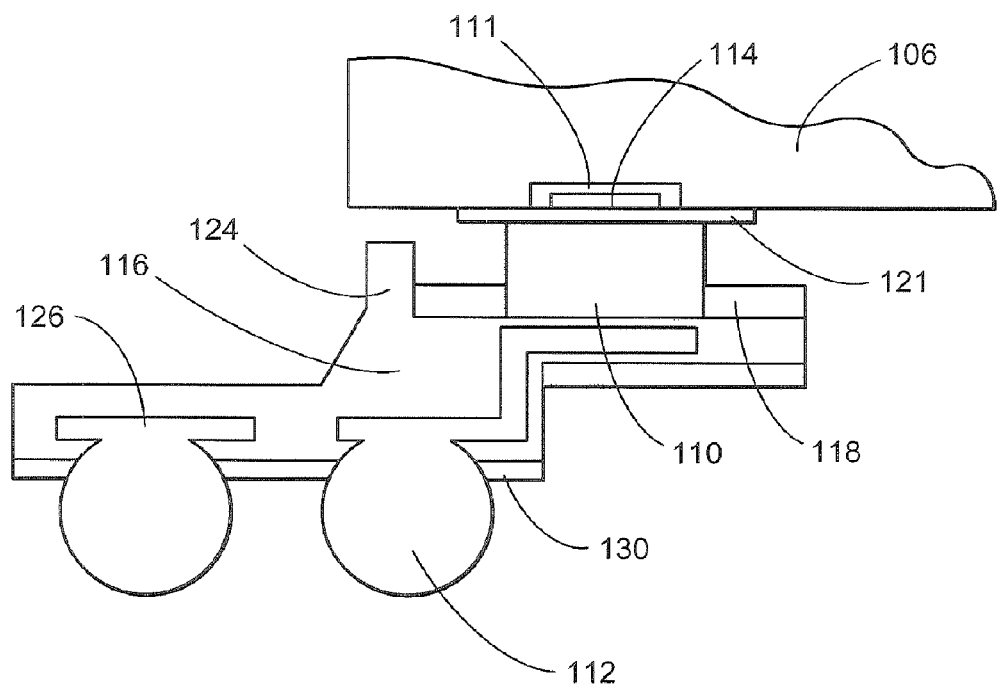
FIG. 10 is a schematic diagram of a cross-sectional view of a hyper thermally enhanced ball grid array package solder bump joint in accordance with one embodiment of the present invention.

Referring now to FIG. 10, therein is shown a schematic diagram of a cross-sectional view of a hyper thermally enhanced ball grid array package solder bump joint in accordance with one embodiment of the present invention. The stud bump 114 couples the exposed portion of the bond pad 111 of the semiconductor chip 106 to the solder pillars/ball bumps 110.

Figure 11:
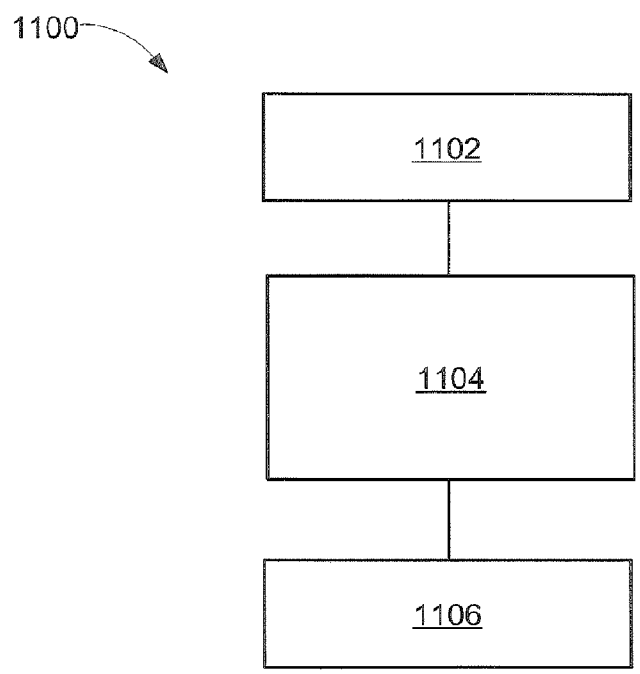
FIG. 11 is a flow chart of a system for thermally enhancing a ball grid array package in accordance with an embodiment of the present invention.

Referring now to FIG. 11, therein is shown a flow chart of a semiconductor package system 1100 in accordance with an embodiment of the present invention. The system 1100 includes: mounting a semiconductor chip to a substrate having a substrate opening in a block 1102; attaching a first heat slug to a first surface of the semiconductor chip and at least partially encapsulating the semiconductor chip in a block 1104; and attaching a second heat slug to a second surface of the semiconductor chip through the substrate opening in a block 1106.

It has been discovered that the present invention thus has numerous advantages.

An advantage is that the present invention package construction, a hyper thermally enhanced ball grid array (HTEBGA), has 80-85% of the total external body covered by heat slugs and solder balls, which is thermally conductive. Such design enhances heat dissipation on all sides of the package. Further the top heat slug 102 and the bottom heat slug 104 provide direct contact with the top and bottom surfaces of the semiconductor chip 106, giving shorter paths for heat to be dissipated. This means faster cooling effect can be achieved.

Another advantage is that extending the aperture on the edges of the top heat slug 102 addressed as the cap flash 108 serves as reinforced structure to enhance encapsulant rigidity, reducing compression and lateral stresses from package chip top, as well as serving as sealing platform to cover the package. The bottom heat slug 104 further enhances effective heat dissipation area of the package.

Another advantage is that non-conductive adhesive (NCA) or non-conductive elastomer (NCE) is used to seal up all exposed areas of the package structure preventing moisture ingression.

Another advantage is that the substrate opening 128 of the substrate 116 has shorter redistributed Cu microvias for eliminating frequency parasitic losses.

Another advantage is that the substrate opening 128 of the substrate 116 also provides a guard ring or the vertical built-up wing 124 on the edges of substrate coiled down area to thinner substrate platform area. This additional feature serves to safeguard the solder mask 118 on the non-contact areas of the top surface of the substrate 116. The solder mask 118 serves to enhance solder bumps rigidity during package second reflow.

Another advantage is that construction of the package required simplified assembly processes as no conventional back end processes and wire bond required. This results in faster time-to-market and shorter assembly cycle time.

Another advantage is that the present invention has small and compact footprint, with chip size housing capability up to 80% of the package case outline.

Another advantage is that the present invention is a hybrid version of Flip-chip, CSP and BGA.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the HTEBGA package system and apparatus of the present invention furnish important and heretofore unknown and unavailable solutions, capabilities, and functional advantages for thermally enhancing BGA packages. The resulting processes and configurations are straightforward, cost-effective, uncomplicated, highly versatile and effective, can be implemented by adapting known technologies, and are thus readily suited for efficiently and economically manufacturing BGA devices.

The resulting processes and configurations are straightforward, cost-effective, uncomplicated, highly versatile and effective, can be implemented by adapting known technologies, and are thus readily suited for efficiently and economically manufacturing large chip IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A semiconductor package method comprising:
mounting a semiconductor chip to a substrate having a substrate opening and a vertical build-up wing, and the vertical build-up wing is circumscribed by vertical planes of a perimeter of, and spaced apart from, the semiconductor chip;
attaching a first heat slug to the substrate at a first horizontal plane and to a first surface of the semiconductor chip, the first heat slug at least partially encapsulating the semiconductor chip; and
attaching a second heat slug above the substrate at a second horizontal plane above the first horizontal plane and to a second surface of the semiconductor chip through the substrate opening.

2. The method as claimed in claim 1 wherein:
mounting the semiconductor chip further comprises reflow soldering stud bumps on the semiconductor chip to solder pillars/ball bumps on the substrate.

3. The method as claimed in claim 1 further comprising:
hermetically sealing the first heat slug to the substrate using a vacuum.

4. The method as claimed in claim 1 wherein:
attaching the first heat slug further comprises providing the first heat slug with a top recess on a top surface thereof; or
attaching the second heat slug further comprises providing the second heat slug with a bottom recess on a bottom surface thereof.

5. The method as claimed in claim 1 wherein:
attaching the first heat slug further comprises providing the first heat slug with a first fin on a top surface thereof; or
attaching the second heat slug further comprises providing the first heat slug with a second fin on a bottom surface thereof.

6. A semiconductor package method comprising:
mounting a semiconductor chip by flipping and electrically connecting former top bonding pads to a substrate having a substrate opening and a vertical build-up wing, and the vertical build-up wing is circumscribed by vertical planes of a perimeter of, and spaced apart from, the semiconductor chip;
attaching a top heat slug above the substrate at a first horizontal plane and to a first surface of the semiconductor chip using a conductive bond, the top heat slug at least partially encapsulating the semiconductor chip; and
attaching a bottom heat slug to the substrate at a second horizontal plane above the first horizontal plane and using a conductive bond to a second surface of the semiconductor chip through the substrate opening.

7. The method as claimed in claim 6 wherein:
mounting the semiconductor chip further comprises reflow soldering stud bumps on the semiconductor chip to solder pillars/ball bumps on the substrate;
attaching the top heat slug further comprises attaching the top heat slug with a non-conductive bond to the top of the substrate; and
attaching the bottom heat slug further comprises attaching the bottom heat slug with a non-conductive bond to the bottom of the substrate.

8. The method as claimed in claim 6 further comprising:
hermetically sealing the top heat slug to the substrate by applying a vacuum or a further sealant through the substrate opening.

9. The method as claimed in claim 6 wherein:
attaching the top heat slug further comprises providing the top heat slug with a top recess in the center of a top surface thereof;
attaching the bottom heat slug further comprises providing the bottom heat slug with a bottom recess in the center of a bottom surface thereof; or
attaching the bottom heat slug further comprises attaching the bottom heat slug in a recessed cavity in the substrate.

10. The method as claimed in claim 6 wherein:
attaching the top heat slug further comprises providing the top heat slug with a first plurality of fins on a top surface thereof;
attaching the bottom heat slug further comprises providing the bottom heat slug with a second plurality of fins on a bottom surface thereof; or
further comprising attaching a ball grid array on the bottom of the substrate electrically connected to the semiconductor chip.

* * * * *

UNITED STATES PATENT AND TRADEMARK OFFICE
CERTIFICATE OF CORRECTION

| | | |
|---|---|---|
| PATENT NO. | : 8,164,182 B2 | Page 1 of 1 |
| APPLICATION NO. | : 11/164209 | |
| DATED | : April 24, 2012 | |
| INVENTOR(S) | : Ong et al. | |

It is certified that error appears in the above-identified patent and that said Letters Patent is hereby corrected as shown below:

In the Specification:

Column 3, line 39, delete "a horizontal top 1 30" and insert therefor --a horizontal top 130--

Column 4, line 50, delete "connects to the ton heat slug 102." and insert therefor --connects to the top heat slug 102.--

Signed and Sealed this
Eighteenth Day of February, 2014

Michelle K. Lee
*Deputy Director of the United States Patent and Trademark Office*